United States Patent
Hui et al.

(10) Patent No.: US 8,937,357 B2
(45) Date of Patent: Jan. 20, 2015

(54) ONE-TIME PROGRAMMABLE SEMICONDUCTOR DEVICE

(75) Inventors: Frank Hui, San Jose, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 554 days.

(21) Appl. No.: 12/660,603

(22) Filed: Mar. 1, 2010

(65) Prior Publication Data
US 2011/0210397 A1 Sep. 1, 2011

(51) Int. Cl.
*H01L 27/112* (2006.01)

(52) U.S. Cl.
CPC ........ *H01L 27/112* (2013.01); *H01L 27/11206* (2013.01)
USPC ...... 257/368; 257/50; 257/530; 257/E23.147; 257/E23.592; 438/131; 438/215; 438/467

(58) Field of Classification Search
USPC ............ 257/368, 50, E23.147; 438/131, 215, 438/467
See application file for complete search history.

(56) References Cited

U.S. PATENT DOCUMENTS 6,410,389 B1 *  6/2002  Cappelletti et al. ........... 438/257
2009/0250726 A1 * 10/2009  Kurjanowicz ................. 257/209

* cited by examiner

*Primary Examiner* — Matthew Gordon
(74) *Attorney, Agent, or Firm* — Oblon, Spivak, McClelland, Maier & Neustadt, L.L.P.

(57) ABSTRACT

According to one embodiment, a one-time programmable (OTP) semiconductor device includes a programming dielectric under a patterned electrode and over an implant region, where the programming dielectric forms a programming region of the OTP semiconductor device. The OTP semiconductor device further includes an isolation region laterally separating the programming dielectric from a coupled semiconductor structure, where the isolation region can be used in conjunction with the patterned electrode and the implant region to protect the coupled semiconductor structure. In one embodiment, the programming dielectric comprises a gate dielectric. In another embodiment, the electrode and implant regions are doped to be electrochemically similar.

20 Claims, 3 Drawing Sheets

ONE-TIME PROGRAMMABLE SEMICONDUCTOR DEVICE

BACKGROUND OF THE INVENTION

1. Field of the Invention

The present invention is generally in the field of semiconductors. More particularly, the present invention is in the field of one-time programmable device fabrication.

2. Background Art

One-time programmable (OTP) devices are used throughout the semiconductor industry to allow for post-fabrication design changes in integrated circuits (ICs). For example, after post-fabrication functionality testing yet before sale to a customer, a semiconductor device manufacturer can program a network of OTP devices embedded in a particular semiconductor die to provide a permanent serial number encoding for that particular die. Under other circumstances, a single OTP device can be programmed to permanently enable or disable a portion of an integrated circuit at any time after fabrication, including after sale to a customer. While this functionality is in great demand, conventional OTP elements (the programmable constituent of an OTP device) can be larger than desired or can require multiple additional fabrication steps beyond those required for conventional transistor fabrication, for example, making conventional OTP devices expensive to manufacture and embed.

One such conventional embedded OTP device can be fabricated using the so-called split-channel approach, where an atypical fabrication process is used to form a gate structure comprising a single channel interface with two different gate dielectric thicknesses. The thin portion of gate dielectric (the OTP element) can be made to destructively break down and form a conductive path from gate to channel, thereby switching the conventional OTP device into a "programmed" state. This approach, however, has a relatively high tendency to result in devices with programmed states where the remaining thick gate structure exhibits a high leakage current due to collateral damage during programming. In addition, this approach tends to render devices with relatively poorly differentiated programmed and un-programmed states (as seen by a sensing circuit), which, in combination with the high leakage current statistics, require a relatively high voltage sensing circuit to reliably read out programmed and un-programmed states. Mitigation of these issues can require additional die space for high-voltage sensing circuitry and/or for redundancy techniques, for example, which can involve undesirable increases in manufacturing cost.

Thus, there is a need to overcome the drawbacks and deficiencies in the art by providing a highly reliable OTP device that leverages existing conventional fabrication procedures.

SUMMARY OF THE INVENTION

A one-time programmable (OTP) semiconductor device, substantially as shown in and/or described in connection with at least one of the figures, as set forth more completely in the claims.

DETAILED DESCRIPTION OF THE INVENTION

Figure 1:
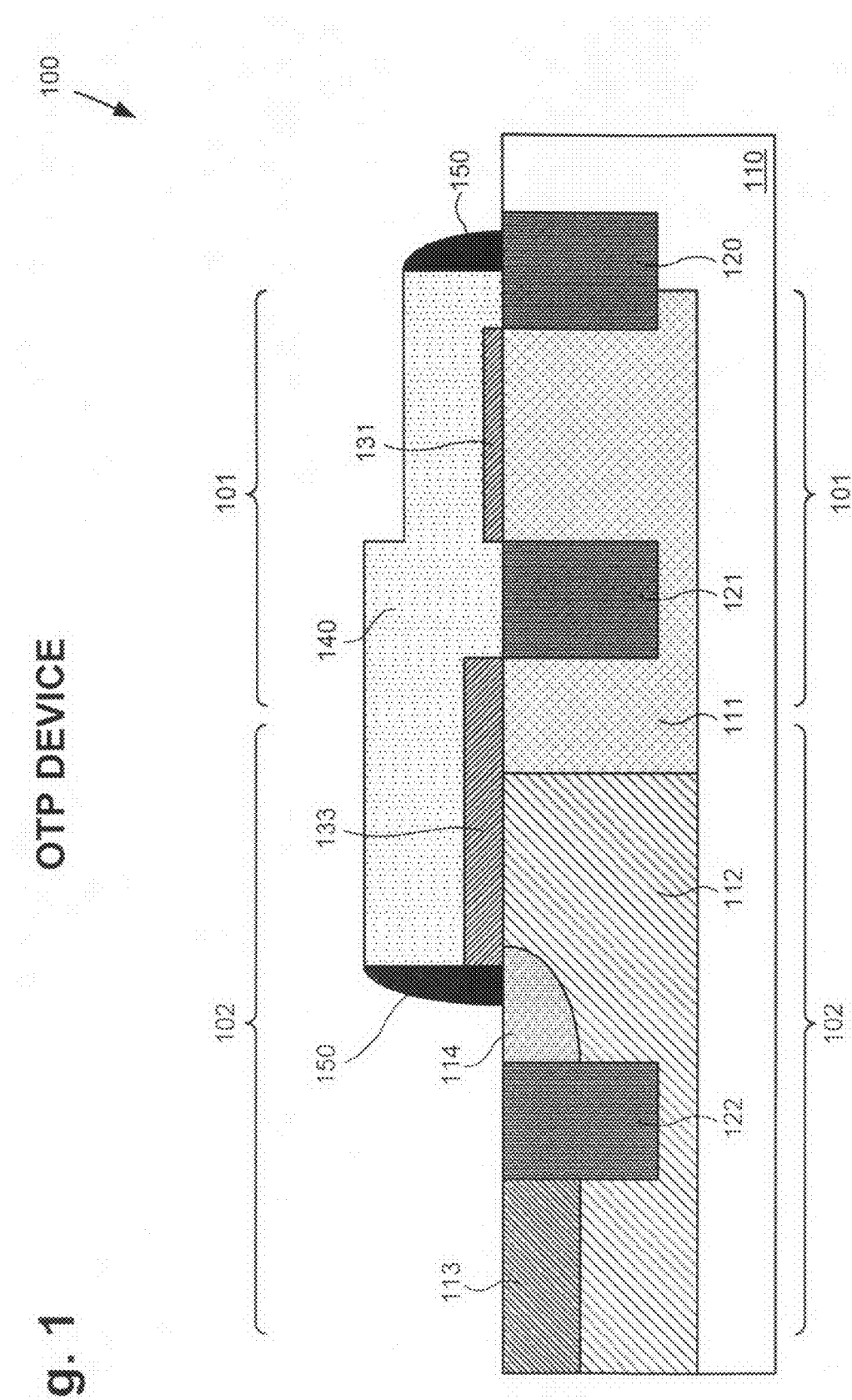
FIG. 1 illustrates a cross-sectional view of a portion of a wafer processed to form a one-time programmable (OTP) semiconductor device, according to one embodiment of the present invention.

The present invention is directed to a one-time programmable (OTP) semiconductor device. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

Conventional embedded OTP elements can be coupled to a variety of semiconductor structures to form many different types of integrated OTP devices such as, for example, fuses, anti-fuses, ROM structures, redundancy structures, OTP resistor networks, high-security encoding structures, and the like. But, each OTP device's reliability can be heavily dependent on the environment required to program it, which in turn can be dictated by the structure of its constituent OTP element.

Conventional OTP elements can require programming conditions (usually a high voltage pulse across the OTP element) that, because of the conventional element's structure, results in collateral damage to the rest of the OTP device. This collateral damage can present itself as, for example, high leakage current through a coupled transistor with a damaged gate dielectric, poor conductivity through a programmed OTP element, or in any number of other ways specific to each OTP device, including a combination of the above, with each tending to result in an OTP device with a poorly differentiated (e.g., difficult to sense) programmed state and an erratically functioning coupled semiconductor structure. These undesirable functioning characteristics can be mitigated by, for example, increasing a sensing voltage or relying on redundant OTP device arrays, respectively, but each mitigation strategy can require additional die area and/or manufacturing cost.

FIG. 1 illustrates a cross-sectional view of an embodiment of the present invention that addresses the above problems. FIG. 1 shows OTP device 100 formed by leveraging processing techniques for fabricating polysilicon-gate (poly-gate) transistors (e.g., P type or N type field-effect transistors—PFETs or NFETs) and other conventional CMOS devices. OTP device 100 can comprise, for example, OTP element 101 combined with, for example, NFET structure 102, where both structures can be formed during a typical poly-gate transistor fabrication process.

As shown in FIG. 1, OTP element 101 can comprise, for example, substrate 110, isolation regions 120 and 121, a portion of implant region 111, programming dielectric 131, a portion of gate dielectric 133 and a portion of patterned electrode 140. NFET structure 102 can comprise, also for example, substrate 110, isolation region 122, implant regions 112-114, a portion of implant region 111, a portion of gate dielectric 133 and a portion of patterned electrode 140. Spacers 150 can be formed around the combination of OTP element 101 and NFET structure 102. Details of composition and formation of the above are more fully explained with respect to FIGS. 2, 3A and 3B below.

In an un-programmed state, OTP element 101 can act, for example, to capacitively couple patterned electrode 140 (e.g., a gate of NFET structure 102) to, for example, implant region 111 (e.g., a drain of NFET structure 102). During a programming phase, a high voltage pulse can be applied, for example, between implant region 112 (e.g., a channel of NFET structure 102) and patterned electrode 140 to break down programming dielectric 131 and form, for example, a conductive path from patterned electrode 140 to implant region 111, resulting in a programmed state where patterned electrode 140 (e.g., a gate of NFET structure 102) can be resistively coupled to, for example, implant region 111 (e.g., a drain of NFET structure 102).

During such a programming phase, OTP element 101 can act to protect NFET structure 102 from collateral damage by, for example, providing structure for a voltage divider network, comprising isolation region 121 and portions of implant regions 111 and 112, that can reduce the voltage across gate dielectric 133 as programming dielectric 131 begins to break down and conduct current from patterned electrode 140 through implant region 111 to, for example, implant region 112. OTP element 101 can also act to protect NFET structure 102 by, for example, sufficiently isolating gate dielectric 133 from programming dielectric 131 such that a destructive lateral current from gate dielectric 133 to programming dielectric 131 does not develop while (or after) programming dielectric 131 breaks down.

In addition to providing protection during programming, OTP element 102 can exhibit a relatively highly conductive programmed state by comprising, for example, an electrode electrochemically matched to a conductive implant region, such as patterned electrode 140 (e.g., an N type electrode) and implant region 111 (e.g., an N type implant region). For example, after programming dielectric 131 is caused to break down, conduction from patterned electrode 140 to implant region 111 can be greater than, for example, conduction from an N type electrode to a P type implant region (e.g., a channel for NFET structure 102 such as implant region 112).

Thus, OTP element 101 can be configured to interface with NFET structure 102 in such a way as to result in OTP device 100, which can exhibit, for example, a highly differentiated programmed state due to, for example, both a low leakage current (a benefit from relatively little collateral damage during programming) and a highly conductive programmed state for OTP element 101. As such, a programmed or un-programmed state for OTP device 100 can be sensed with, for example, a relatively low applied voltage, thereby reducing overall manufacturing cost by reducing a die area required to integrate reliable sensing circuitry. In addition, NFET structure 102 can substantially retain its typical functioning characteristics without those characteristics being degraded by, for example, collateral damage to its structure during application of a programming pulse, thereby additionally reducing overall manufacturing cost by, for example, reducing a need for redundant circuitry to ensure reliable readout of programmed states.

Figure 2:
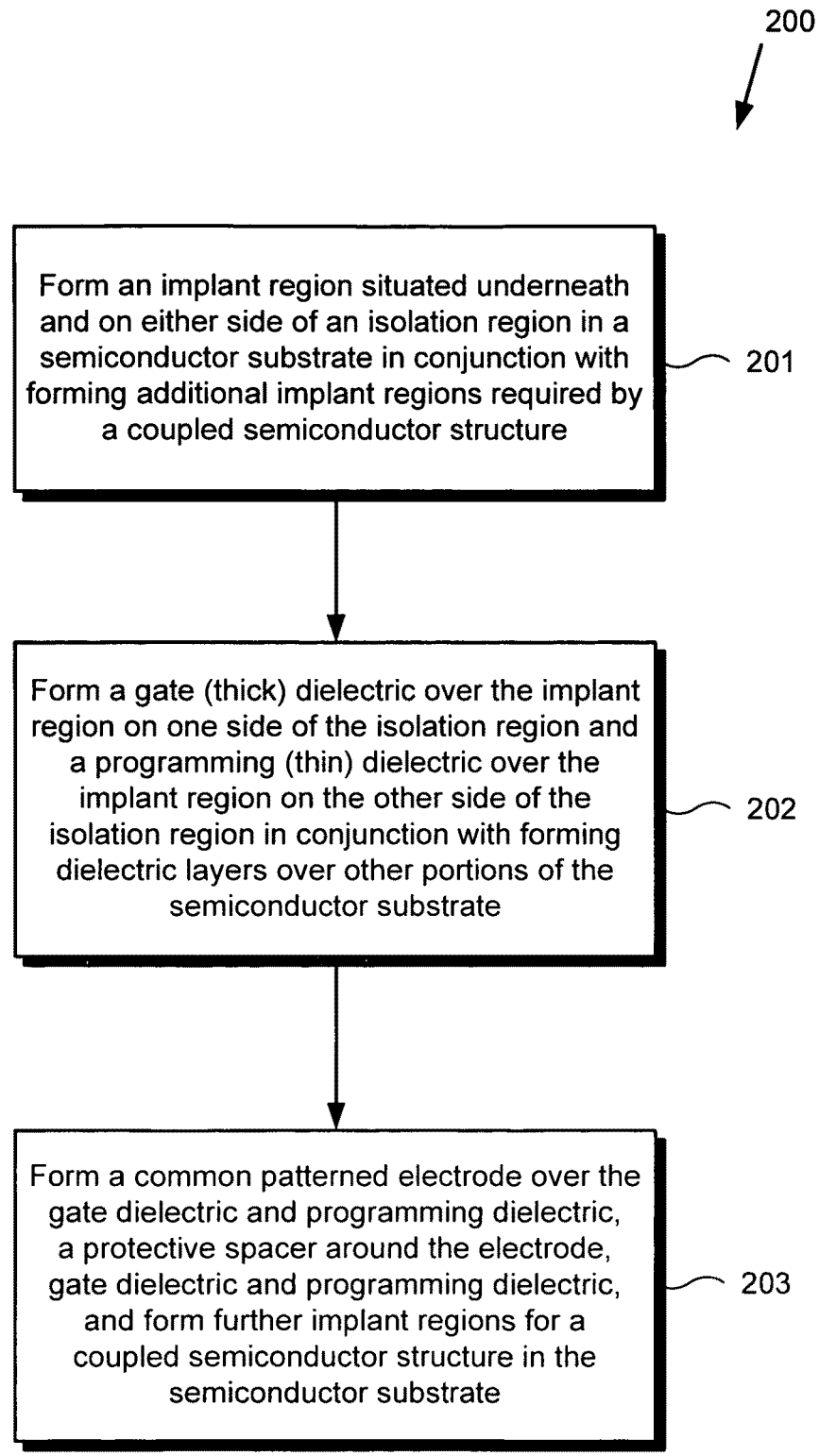
FIG. 2 shows a flowchart illustrating steps taken to implement a method of fabricating an OTP semiconductor device, according to an embodiment of the present invention.

FIG. 2 shows a flow chart illustrating a method for fabricating an OTP semiconductor device, according to one embodiment of the present invention. Certain details and features have been left out of flowchart 200 that are apparent to a person of ordinary skill in the art. For example, a step may consist of one or more substeps or may involve specialized equipment or materials, as known in the art. Steps 201 through 203 indicated in flowchart 200 are sufficient to describe one embodiment of the present invention; however, other embodiments of the invention may make use of steps different from those shown in flowchart 200.

Figure 3A:
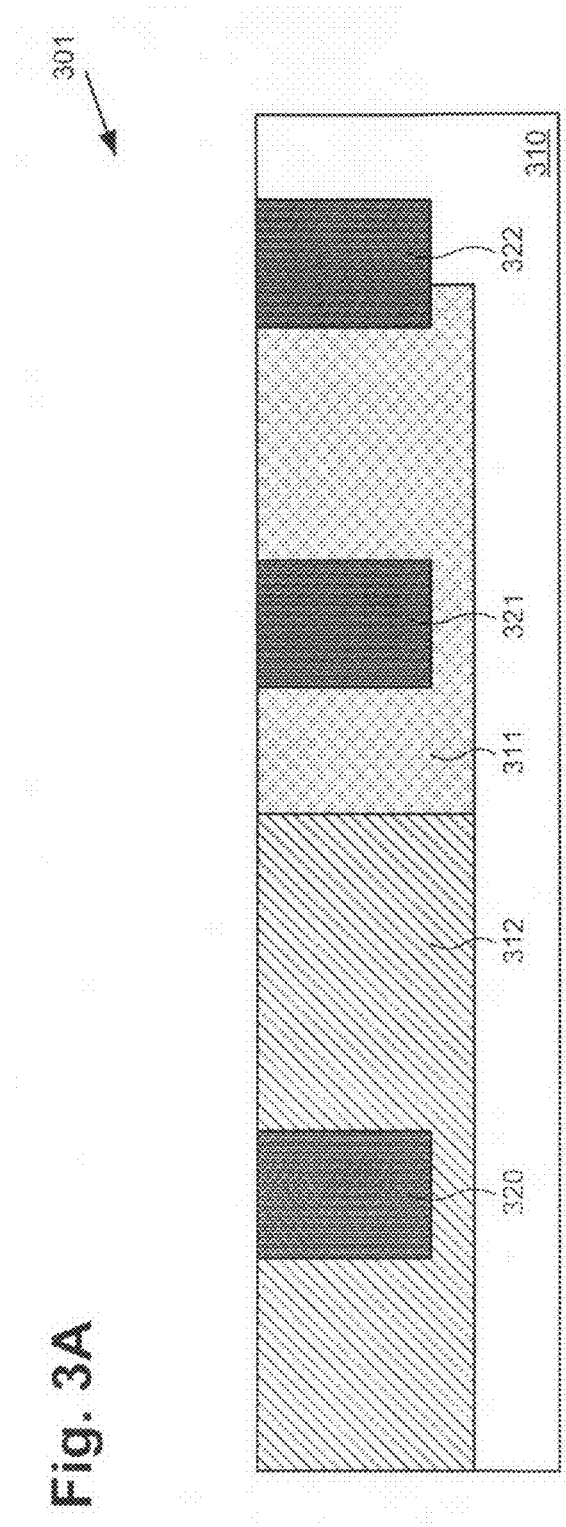
FIG. 3A illustrates a cross-sectional view, which includes a portion of a wafer processed according to an embodiment of the invention, corresponding to an initial step in the flowchart in FIG. 2.
Figure 3B:
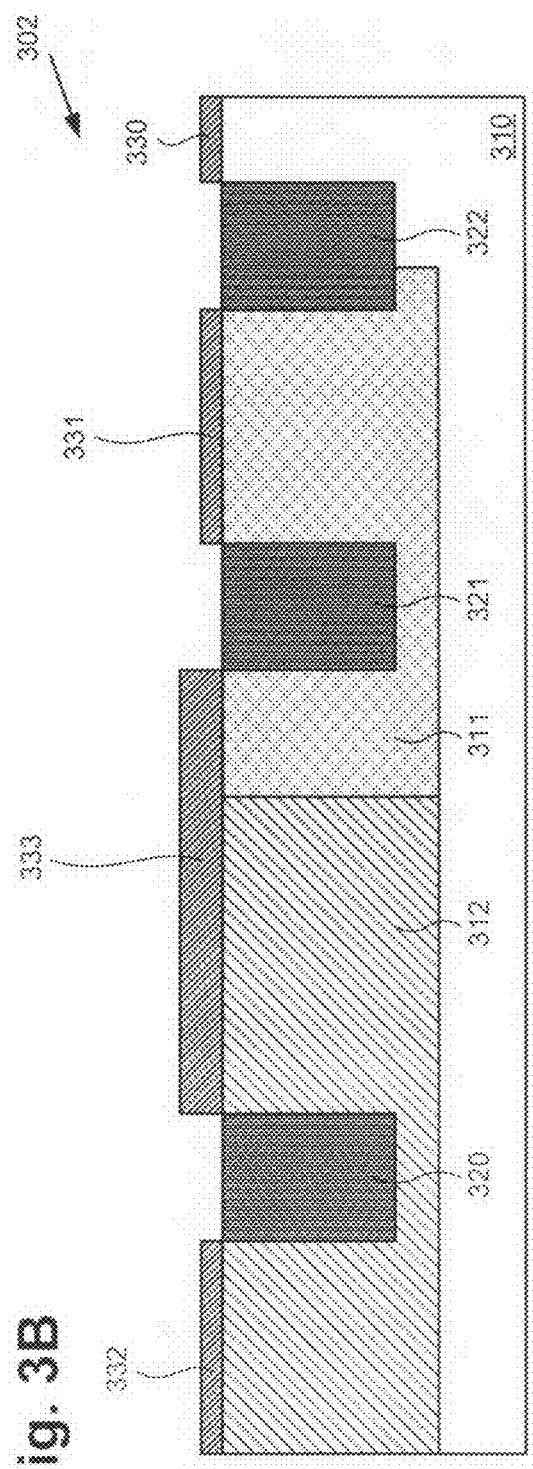
FIG. 3B illustrates a cross-sectional view, which includes a portion of a wafer processed according to an embodiment of the invention, corresponding to an intermediate step in the flowchart in FIG. 2.

Moreover, FIGS. 3A, 3B, and 1 illustrate the result of performing steps 201 through 203 of flowchart 200, respectively. For example, FIG. 3A shows a semiconductor structure after processing step 201, FIG. 3B shows the structure in FIG. 3A after processing step 202, and FIG. 1 shows the structure in FIG. 3B after processing step 203.

It is noted that the processing steps shown in flowchart 200 are performed on a portion of a processed wafer, which, prior to step 201, may include a semiconductor substrate, such as a silicon substrate, and isolation regions, such as STI regions, formed in the substrate using conventional techniques. The wafer is also referred to simply as a wafer or a semiconductor die or simply a die in the present application. It is also noted that substrate 310, isolation regions 320, 321 and 322, programming dielectric 331 and gate dielectric 333 in FIGS. 3A and 3B correspond respectively to substrate 110, isolation regions 120, 121 and 122, programming dielectric 131 and gate dielectric 133 as discussed with respect to FIG. 1 above, e.g., each corresponding features can comprise the same material as its counterpart, and each can be formed utilizing the same methods used to form its counterpart.

Referring now to step 201 of the method embodied in FIG. 2, step 201 of flowchart 200 comprises forming an implant region around an isolation region in a semiconductor substrate while forming additional implant regions required for a coupled semiconductor structure. FIG. 3A shows a structure including substrate 310 and isolation regions 320, 321 and 322 after completion of step 201 of flowchart 200 in FIG. 2, where implant region 311 can be formed, for example, around isolation region 321. Also shown is implant region 312 which can be similarly formed around isolation region 322.

As depicted in FIG. 3A, substrate 310 can comprise, for example, silicon, and can be configured to support formation of isolation regions 320, 321 and 322 and implant regions 311 and 312, or to support other semiconductor structures or multiple embodiments of any of the above. Isolation regions 320, 321 and 322 can be shallow trench isolation (STI) regions comprised of silicon oxide or other dielectric material, for example, and can be configured to electrically isolate semiconductor structures formed to either side of each isolation region from each other or to isolate semiconductor structures from substrate 310.

Implant region 311 can be, for example, a lightly doped N type implant region of substrate 310 (e.g., an implant region suitable for forming an N-well drain for an NFET) and can be formed, for example, by a high-energy implant and annealing procedure performed as part of a conventional transistor fabrication process step as known in the art. Implant region 311 can be configured, for example, to serve both as a conductive path to facilitate breakdown of programming dielectric 131 of FIG. 1 and as an element of NFET structure 102 of FIG. 1 (e.g., as a drain for NFET structure 102).

Also shown in FIG. 3A is implant region 312 formed around isolation region 322. Implant region 312 can be, for example, a lightly doped P type implant region of substrate 310 (e.g., an implant region suitable for forming a P-well channel for an NFET) and can be formed, for example, by a high energy implant and annealing procedure performed as part of a conventional transistor fabrication process step as known in the art. Implant region 312 can be configured, for example, as an element of NFET structure 102 of FIG. 1 (e.g., as a channel for NFET structure 102).

Continuing with step 202 in FIG. 2 and referring to FIG. 3B, step 202 of flowchart 200 comprises forming a relatively thick gate dielectric over a portion of implant region 311 and forming a relatively thin programming dielectric over a separate portion of implant region 311 in conjunction with forming other dielectric segments over portions of substrate 310. FIG. 3B shows the structure in FIG. 3A after completion of step 202 of flowchart 200, where a portion of gate dielectric 333 can be formed over implant region 311 on a side of isolation region 321, and programming dielectric 331 can be formed over implant region 311 on a separate side of isolation region 321. Also shown are programming dielectrics 330 and 332 which can act as elements of other semiconductor structures or be removed by a later patterning step as described below.

Gate dielectric 333 can be a segment of relatively thick gate dielectric (e.g., a dielectric suitable for forming an NFET gate dielectric) comprising, for example, an oxide, such as silicon dioxide ($SiO_2$) or the like, and can be formed by, for example, employing a physical vapor deposition (PVD) process, a chemical vapor deposition (CVD) process, or other deposition process in conjunction with a conventional mask and etch process as known in the art. Gate dielectric 333 can be configured, for example, to serve both as an element of NFET structure 102 of FIG. 1 (e.g., as a gate dielectric for NFET structure 102) and as part of an interface between OTP element 101 and NFET structure 102, both of FIG. 1.

Programming dielectrics 330, 331 and 332 can be segments of relatively thin gate dielectric (e.g. a dielectric suitable for forming an NFET gate dielectric) comprising, for example, an oxide, such as silicon dioxide ($SiO_2$) or the like, and can be formed by, for example, employing a physical vapor deposition (PVD) process, a chemical vapor deposition (CVD) process, or other deposition process in conjunction with a conventional mask and etch process as known in the art. In particular, programming dielectric 331 can be configured, for example, to serve as a programming dielectric exhibiting reliable breakdown characteristics for OTP element 101.

Moving now to step 203 of FIG. 2 and referring to FIG. 1, step 203 of flowchart 200 comprises forming a common patterned electrode over gate dielectric 333 and programming dielectric 331 of FIG. 3B, forming protective spacers around the patterned electrode and dielectrics, and forming additional implant regions to facilitate fabrication of coupled semiconductor structures, such as NFET structure 102 of FIG. 1. FIG. 1 shows the structure in FIG. 3B after completion of step 203 of flowchart 200, where patterned electrode 140 can be formed over both programming dielectric 131 and gate dielectric 133 (where each dielectric can be patterned to match the extent of patterned electrode 140), spacers 150 can be formed around patterned electrode 140, programming dielectric 131 and gate dielectric 133, and where implant regions 113 and 114 can be formed in substrate 110 to facilitate fabrication of NFET structure 102.

Patterned electrode 140 can be, for example, a patterned segment of N type doped polysilicon, or some other material suitable for forming, for example, a transistor gate electrode for an NFET, and can be formed in layer form over a layer or layers of dielectric (e.g., programming dielectric 131 and gate dielectric 133) by, for example, employing a low pressure chemical vapor deposition (LPCVD) process or other suitable deposition process coupled with a doping process as known in the art. Such layer can then be patterned, along with any layers formed under or over it, into, for example, patterned electrode 340 using, for example, a conventional mask and etch process as known in the art. Patterned electrode 340 can be configured, for example, to serve concurrently as a gate electrode for an NFET (e.g., for NFET structure 102) and as a programming electrode for a programmable element (e.g., for OTP element 101). Patterned electrode 140 can also be configured to be electrochemically matched to implant region 111 to enable a high conductivity programmed state for OTP element 101.

Spacers 150 can comprise silicon oxide or other dielectric material as known in the art, and can be formed, for example, by conformally depositing a layer of dielectric material, such as silicon oxide, over patterned electrode 140, programming dielectric 131 and gate dielectric 133, or multiple embodiments thereof, by employing a CVD process or other deposition process and then appropriately etching the layer of dielectric material in an etch-back process as known in the art. As shown in FIG. 1, spacers 150 can be configured to protect and isolate one or more OTP devices such as OTP device 100.

Implant region 113 can be, for example, a heavily doped P type implant region of substrate 110 (e.g., an implant region suitable for forming a highly conductive path to another P type implant region) and can be formed, for example, by a high-energy implant and annealing procedure performed as part of a conventional transistor fabrication process step as known in the art. Implant region 113 can be configured to serve, for example, as a highly conductive path to implant region 112.

Also shown in FIG. 1 is implant region 114 formed partially under gate dielectric 133. Implant region 314 can be, for example, a heavily doped N type implant region of substrate 310 (e.g., an implant region suitable for forming a source for an NFET) and can be formed, for example, by a high energy implant and annealing procedure performed as part of a conventional transistor fabrication process step as known in the art. Implant region 114 can be configured to serve, for example, as an element of NFET structure 102 (e.g., as a source for NFET structure 102).

After completion of step 203 of flowchart 200 in FIG. 2, patterned silicide layers, additional protective dielectric layers and metal contacts can be formed over OTP device 100 using multiple conventional layering, mask and etch processes as known in the art, where each can be configured to facilitate later integration of OTP device 100 into analog and mixed signal semiconductor circuits such as integrated circuits (ICs) containing, for example, multiple NFETs, PFETs, integrated resistors, integrated capacitors and integrated OTP devices formed according to the present inventive concepts.

While the embodiment in FIG. 1 can comprise a single OTP element 101 and a single NFET structure 102, other embodiments of the present invention can comprise many multiple embodiments of either, where each design is limited only by available wafer size and available fabrication techniques. It is also noted that while the embodiment shown in FIGS. 3A, 3B and 1 may be characterized as an OTP device comprising an OTP element fabricated in conjunction with an NFET structure, such that patterned electrode 140, a portion of gate dielectric 133 and implant region 111 can be concurrent constituients of both structures, in another embodiment, the process for forming OTP element 101 can be suitably modified to correspond to a PFET structure process (not explicitly shown by the present figures), such that the patterned electrode, gate dielectric and implant region of OTP element 101 can be concurrent constituients of a PFET structure (also not explicitly shown by the present figures).

Thus, by leveraging materials and processes available as part of a typical transistor fabrication process, the process for forming an embodiment of the disclosed embedded OTP element is compatible with multiple typical transistor fabrication processes. Consequently, by forming at least one OTP element in at least one region of a substrate while concurrently forming at least one NFET or PFET structure in another region of a substrate, an embodiment of the present invention can advantageously form an OTP semiconductor device without requiring additional masks or process steps beyond those required to form the NFET or PFET structures. By requiring no additional processing steps, embodiments of the present invention provide an OTP semiconductor device that can be fabricated at a significantly lower cost compared to a conventional OTP device, as is described above. Additionally, because the present inventive concepts disclose an embedded OTP element that can better protect coupled semiconductor structures as well as exhibit a relatively highly differentiated programmed state, embodiments of the present invention provide a reliable OTP semiconductor device that can lead, for example, to overall advantageous reductions in OTP device size and complexity.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable (OTP) semiconductor device comprising:
   an isolation region formed in a semiconductor substrate;
   a first implant region having substantially uniform conductivity formed substantially about a bottom surface and vertical sides of said isolation region in said semiconductor substrate, said first implant region being sandwiched between the semiconductor substrate and the bottom surface of the isolation region and disposed about the vertical sides of the isolation region;
   a gate dielectric having a first thickness formed over a first portion of said first implant region;
   a programming dielectric having a second thickness less than said first thickness formed over a second portion of said first implant region;
   an electrode formed over said gate dielectric and said programming dielectric;
   said isolation region substantially separating said gate dielectric from said programming dielectric.

2. The OTP semiconductor device of claim 1, wherein said isolation region is a shallow trench isolation (STI) region.

3. The OTP semiconductor device of claim 1, further comprising protective spacers formed over said semiconductor substrate and around said electrode, said gate dielectric and said programming dielectric.

4. The OTP semiconductor device of claim 1, further comprising a transistor structure formed substantially concurrently with an OTP element of said OTP semiconductor device, wherein said gate dielectric and said electrode comprise a gate of said transistor structure.

5. The OTP semiconductor device of claim 4, further comprising second and third implant regions formed in said semiconductor substrate, wherein said first implant region and said second and third implant regions comprise a drain, channel and source for said transistor structure.

6. The OTP semiconductor device of claim 5, wherein at least one of said second and third implant regions are formed substantially around a second isolation region formed in said semiconductor substrate.

7. The OTP semiconductor device of claim 5, further comprising at least one metal contact formed over at least one of said electrode and said second and third implant regions.

8. A method of fabricating a one-time programmable (OTP) semiconductor device, said method comprising:
   forming an isolation region in a semiconductor substrate;
   forming a first implant region having substantially uniform conductivity substantially around said isolation region in said semiconductor substrate, said first implant region being sandwiched between the semiconductor substrate and the bottom surface of the isolation region and disposed about the vertical sides of the isolation region;
   forming a gate dielectric having a first thickness over a first portion of said first implant region;
   forming a programming dielectric having a second thickness less than said first thickness over a second portion of said first implant region;
   forming an electrode over said gate dielectric and said programming dielectric;
   said isolation region substantially separating said gate dielectric from said programming dielectric.

9. The method of claim 8, wherein said isolation region is an STI region.

10. The method of claim 8, further comprising forming protective spacers over said semiconductor substrate and around said electrode, said gate dielectric and said programming dielectric.

11. The method of claim 8, further comprising forming a transistor structure substantially concurrently with an OTP element of said OTP semiconductor device, wherein said gate dielectric and said electrode comprise a gate of said transistor structure.

12. The method of claim 11, further comprising forming second and third implant regions in said semiconductor substrate, wherein said first implant region and said second and third implant regions comprise a drain, channel and source for said transistor structure.

13. The method of claim 12, wherein at least one of said second and third implant regions are formed substantially around a second isolation region in said semiconductor substrate.

14. The method of claim 12, further comprising forming at least one metal contact over at least one of said electrode and said second and third implant regions.

15. An integrated circuit (IC) including at least one CMOS device and at least one one-time programmable (OTP) semiconductor device, said OTP semiconductor device comprising:

an isolation region formed in a semiconductor substrate of said IC;

a first implant region having substantially uniform conductivity formed substantially around said isolation region in said semiconductor substrate, said first implant region being sandwiched between the semiconductor substrate and the bottom surface of the isolation region and disposed about the vertical sides of the isolation region;

a gate dielectric having a first thickness formed over a first portion of said first implant region;

a programming dielectric having a second thickness less than said first thickness formed over a second portion of said first implant region;

an electrode formed over said gate dielectric and said programming dielectric;

said isolation region substantially separating said gate dielectric from said programming dielectric.

16. The IC of claim 15, wherein said isolation region is a shallow trench isolation (STI) region.

17. The IC of claim 15, further comprising protective spacers formed over said semiconductor substrate and around said electrode, said gate dielectric and said programming dielectric.

18. The IC of claim 15, further comprising a transistor structure formed substantially concurrently with an OTP element of said OTP semiconductor device, wherein said gate dielectric and said electrode comprise a gate of said transistor structure.

19. The IC of claim 18, further comprising second and third implant regions formed in said semiconductor substrate, wherein said first implant region and said second and third implant regions comprise a drain, channel and source for said transistor structure.

20. The IC of claim 18, further comprising at least one metal contact formed over at least one of said electrode and said second and third implant regions.

* * * * *